(12) United States Patent
Wu et al.

(10) Patent No.: US 8,723,261 B2
(45) Date of Patent: *May 13, 2014

(54) RECESSED GATE TRANSISTOR WITH CYLINDRICAL FINS

(75) Inventors: Tieh-Chiang Wu, Taoyuan County (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 508 days.

This patent is subject to a terminal disclaimer.

(21) Appl. No.: 13/081,499

(22) Filed: Apr. 7, 2011

(65) Prior Publication Data

US 2012/0256256 A1 Oct. 11, 2012

(51) Int. Cl.
*H01L 27/12* (2006.01)
(52) U.S. Cl.
USPC .......................................... 257/347; 257/349
(58) Field of Classification Search
USPC .................................. 257/347, 353, E27.212
See application file for complete search history.

(56) References Cited

U.S. PATENT DOCUMENTS

| 5,270,257 | A | * | 12/1993 | Shin | 438/300 |
| 7,880,232 | B2 | * | 2/2011 | Fischer et al. | 257/353 |
| 2007/0099383 | A1 | | 5/2007 | Han | |
| 2008/0073709 | A1 | | 3/2008 | Fujimoto | |
| 2012/0329226 | A1 | * | 12/2012 | Mouli | 438/270 |

* cited by examiner

*Primary Examiner* — Howard Weiss
*Assistant Examiner* — Steven Rao
(74) *Attorney, Agent, or Firm* — Winston Hsu; Scott Margo

(57) ABSTRACT

A recessed gate transistor with cylindrical fins is disclosed. The recessed gate transistor is disposed in an active region of a semiconductor substrate. Two isolation regions disposed in the semiconductor substrate to define an active region therebetween. The recessed gate transistor includes a gate structure, a source doping region and a drain doping region. The gate structure has at least three fins forms a concave and convex bottom of the gate structure. The front fin is disposed in one of the two isolation regions, the middle fin is disposed in the active region and a last fin disposed in the other one of the two isolation regions. The front fin and the last fin are both cylindrical. A lower part of the gate structure is M-shaped when view from the source doping region to the drain doping region direction.

13 Claims, 8 Drawing Sheets

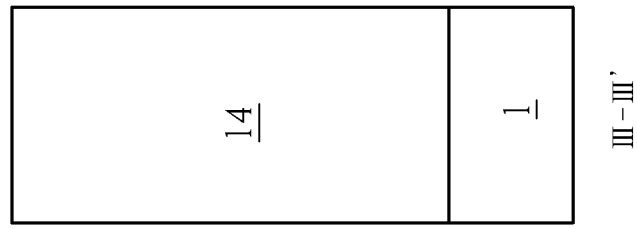
FIG. 3

RECESSED GATE TRANSISTOR WITH CYLINDRICAL FINS

BACKGROUND OF THE INVENTION

1. Field of the Invention

The present invention relates generally to a recessed gate transistor. More particularly, the present invention relates to a recessed gate transistor having cylindrical fins.

2. Description of the Prior Art

In general, as semiconductor devices are highly integrated, the gate channel lengths of the highly integrated semiconductor devices are significantly shortened.

For example, in a planar MOS transistor, as the channel length is reduced, electric fields may affect operation of the planar MOS transistor due to drain induced barrier lowering (DIBL). Also, a channel-driving capacity of a gate conductor may be deteriorated such that a short channel effects may occur.

In order to prevent the short channel effect and DIBL, various semiconductor fabrication technologies capable of lengthening an effective line width of a channel have been developed. For example, a recess gate forming technology is suggested by prior art. According to the recess gate forming technology, a recess is formed in a semiconductor substrate and a gate is formed in the recess, thereby lengthening the effective length of a channel.

However, the gate insulating layer of the semiconductor device fabricated through the conventional forming technology has a thin gate insulating layer at the gate edge, thereby causing the inferior gate induced drain leakage (GIDL) characteristics. This problem may deteriorate the operating performance of the devices.

SUMMARY OF THE INVENTION

It is one object of this invention to provide an improved gate transistor device with cylindrical fins so as to solve the shortcomings of the prior art and to improve the operating performance.

According to the claimed invention, a recessed gate transistor with cylindrical fins, includes: a semiconductor substrate, two isolation regions disposed in the semiconductor substrate to define an active region therebetween, a gate structure disposed in the semiconductor substrate, wherein the gate structure comprises a upper part and a lower part, the upper part is disposed in the active region, and the lower part has a front fin disposed in one of the two isolation regions, at least one middle fin disposed in the active region, and a last fin disposed in the other one of the two isolation regions, and the front fin, and the last fin are both cylindrical, a source doping region disposed in the active region at one side of the gate structure and a drain doping region disposed in the active region at the other side of the gate structure.

The cylindrical fins elongate the channel length, and more channels can be formed so that the performance of the recess gate transistor becomes better. Moreover, the current leakage and GIDL properties are prevented due to the concave and convex bottom of the gate structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 to FIG. 8 are schematic, cross-sectional diagrams showing the process steps for forming the recessed gate transistor with cylindrical fins according to this invention.

DETAILED DESCRIPTION

Figure 1:
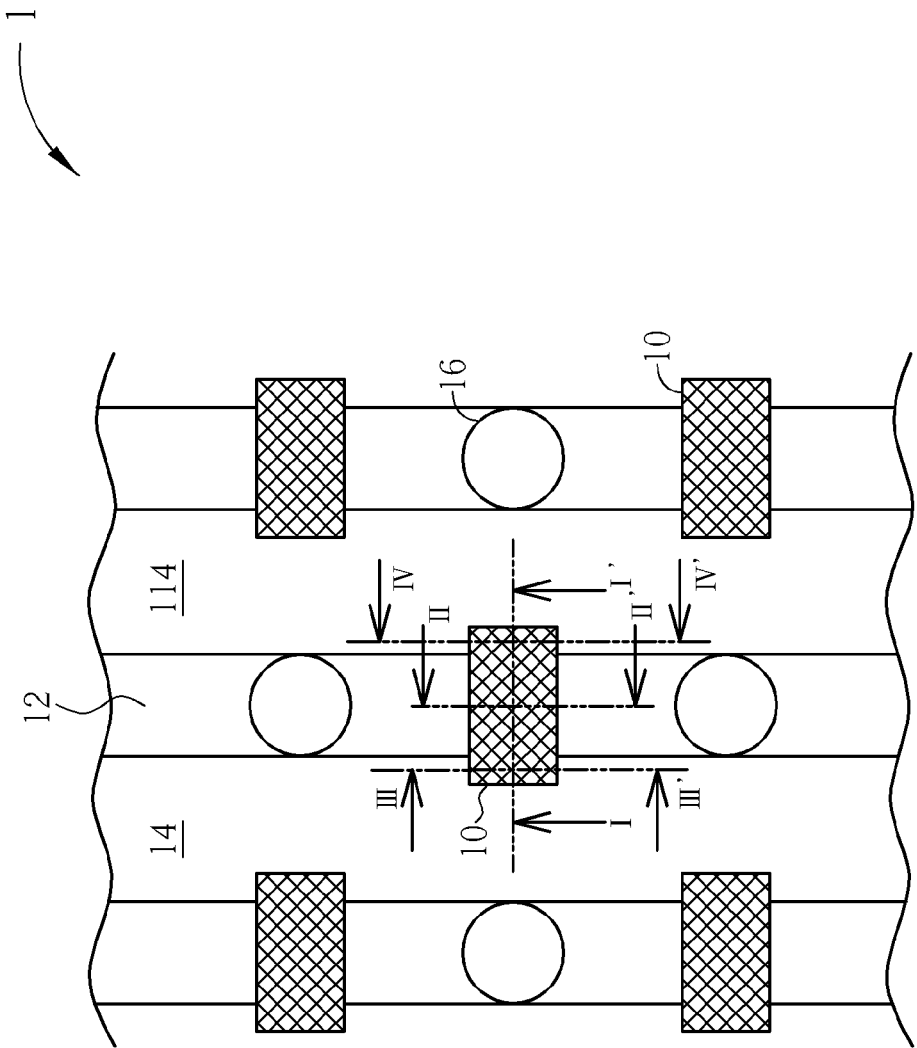
FIG. 1 is a schematic diagram showing a portion of the layout of a capacitor DRAM array and a recessed gate transistor in accordance with one preferred embodiment of this invention.

The present invention will be described more fully hereinafter with reference to the accompanying drawings in which an embodiment of the invention is shown. This invention may, however, be embodied in many different forms and should not be construed as being limited to the embodiment set forth herein. Rather, the embodiment is provided so that this disclosure is thorough and complete and fully conveys the scope of the invention to those skilled in the art, in the drawings, the shapes and forms of elements are exaggerated for clarity.

The present invention pertains to a recessed gate transistor with cylindrical fins, which is suited for DRAM devices or other semiconductor devices.

Figure 2:
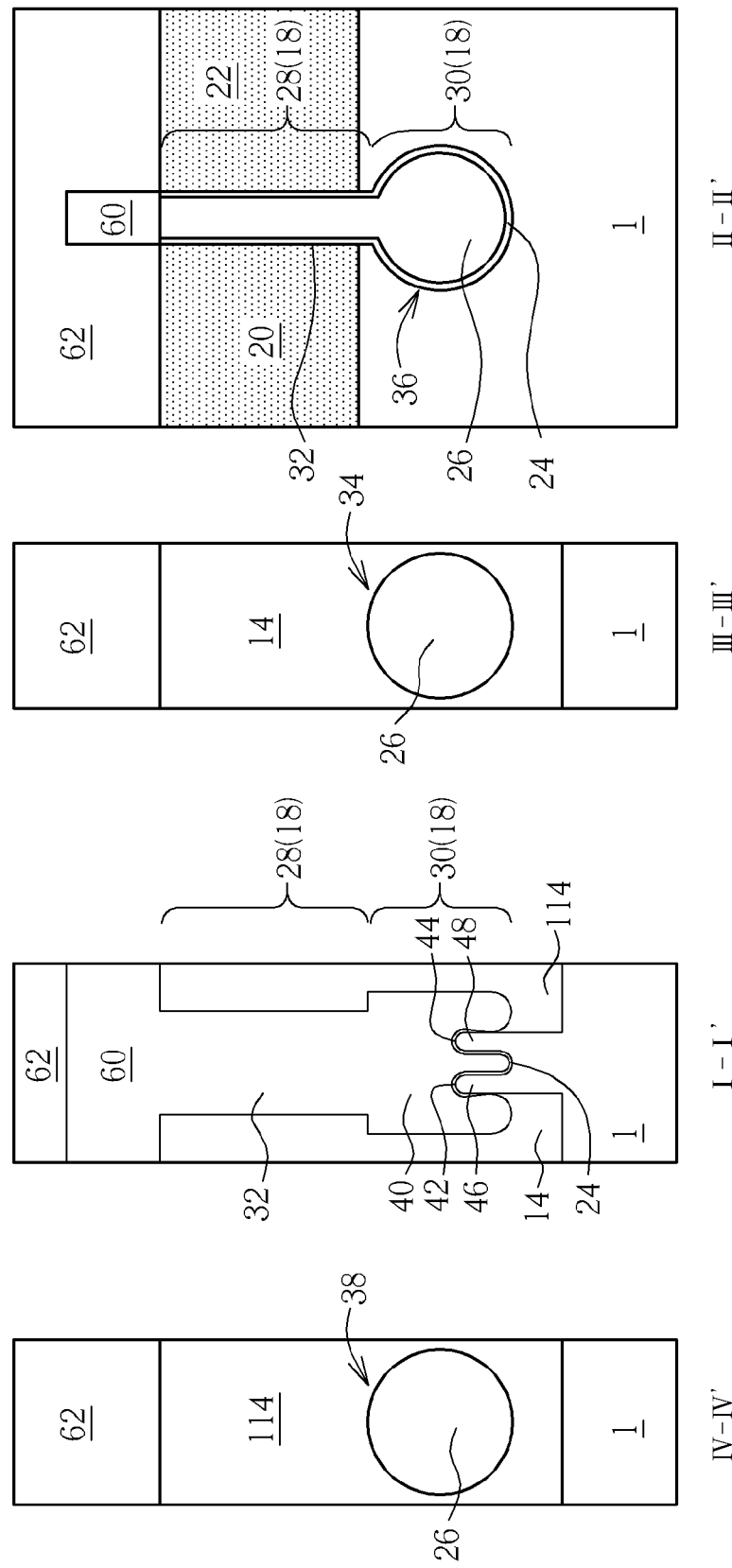
FIG. 2 depicts schematic, cross-sectional views taken along lines I-I', II-II', III-III' and IV-IV' of FIG. 1, respectively.

Please refer to FIG. 1 and FIG. 2. FIG. 1 is a schematic diagram showing a portion of the layout of a capacitor DRAM array and a recessed gate transistor in accordance with one preferred embodiment of this invention. FIG. 2 depicts schematic, cross-sectional views taken along lines I-I', II-II', III-III', IV-IV' of FIG. 1, respectively.

As shown in FIG. 1 and FIG. 2, a recessed gate transistor 10 is disposed in a semiconductor substrate 1 within an active region 12 positioned between two shallow trench isolations (STI) 14, 114. A capacitor structure 16 is disposed in close proximity to the recessed gate transistor 10 constitute a memory cell unit.

Please refer to both FIG. 1 and FIG. 2, a recessed gate transistor 10 comprises a gate structure 18, a source doping region 20 and a drain doping region 22. The gate structure 18 includes a gate oxide layer 24, and a gate conductor 26. The gate conductor 26 can be made of polysilicon, metals or combinations thereof. The gate structure 18 includes two parts, an upper part 28 and a lower part 30. The upper part 28 is disposed in the semiconductor substrate 1 in the active region 12. The upper part 28 has a vertical sidewall 32. The lower part 30 has at least three fins, a front fin 34, at least one middle fin 36 and a last fin 38. The front fin 34 is disposed in one of the two isolation regions 14, 114, for example, the isolation region 14. The last fin 38 is disposed in the other one of the two isolation regions 14, 114, for example, the isolation region 114. The at least one middle fin 36 is disposed in semiconductor substrate 1 within the active region 12. According to the preferred embodiment of the present invention, the number of the middle fin 36 is one, but not limited to it. The number of the middle fin 36 can be more than one. It is note worthy that the front fin 34 and the last fin 38 are symmetric, and the front fin 34 and the last fin 38 are cylindrical. Preferably, the middle fin 36 is also cylindrical, and the radius of the middle fin 36 can be smaller or substantially identical to the radius of the front fin 34. Because of the at least three fins, the lower part 30 of the gate structure 18 forms a concave and convex bottom.

The source doping region 20 is disposed in the semiconductor substrate 1 within the active region 12 at one side of the gate structure 18. The drain doping region 22 is disposed in the semiconductor substrate 1 within the active region 12 at the other side of the gate structure 18.

Please refer to FIG. 2, in the cross-sectional view taken along lines I-I', the lower part 30 further comprises joint elements 40 connect the front fin 34 to the middle fin 36 next to the front fin 34, and connect to the last fin 38 to the middle fin 36 next to the last fin 38. Furthermore, the front fin 34 and the middle fin 36 next to the front fin 34 define a first recessed region 42, and the last fin 38 and the middle fin 36 next to the last fin 38 define a second recessed region 44. The semiconductor substrate 1 in the active region 12 has a first protrusion 46 and a second protrusion 48. The first protrusion 46 engages with the first recessed region 42, and the second protrusion 48 engages with the second recessed region 44. In other words, the front fin 34 and the middle fin 36 next to the front fin 34 sandwich the first protrusion 46, and the last fin 38 and the middle fin 36 next to the last fin 38 sandwich the second protrusion 48.

Moreover, it is one kernel feature of the present invention that the lower part of the gate structure 18 is M-shaped when view from the source doping region 20 to the drain doping region 22 direction.

Furthermore, a word line 60 can be disposed on the gate structure 18, and an insulation layer 62 can cover the word line 60 and the STIs 14, 114.

Please refer to FIG. 3 to FIG. 8. FIG. 3 to FIG. 8 are schematic, cross-sectional diagrams showing the process steps for forming the recessed gate transistor with cylindrical fins according to this invention, wherein the I-I' cross-section, II-II' cross-section and III-III' cross-section are presented in each figure and like numeral numbers designate like elements, regions or layers. Because IV-IV' cross-section is symmetric to III-III' cross-section, IV-IV' cross-section is omitted in the diagram.

Figure 4:
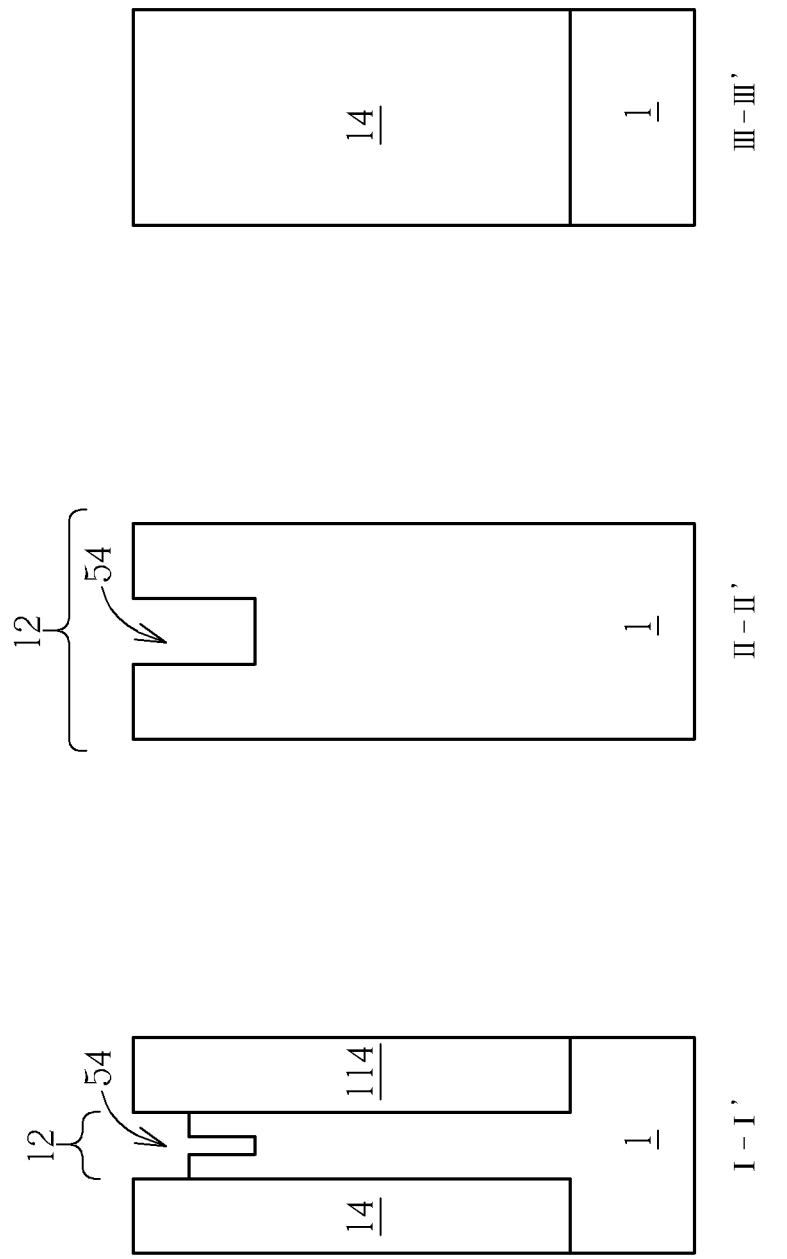
Figure 5:
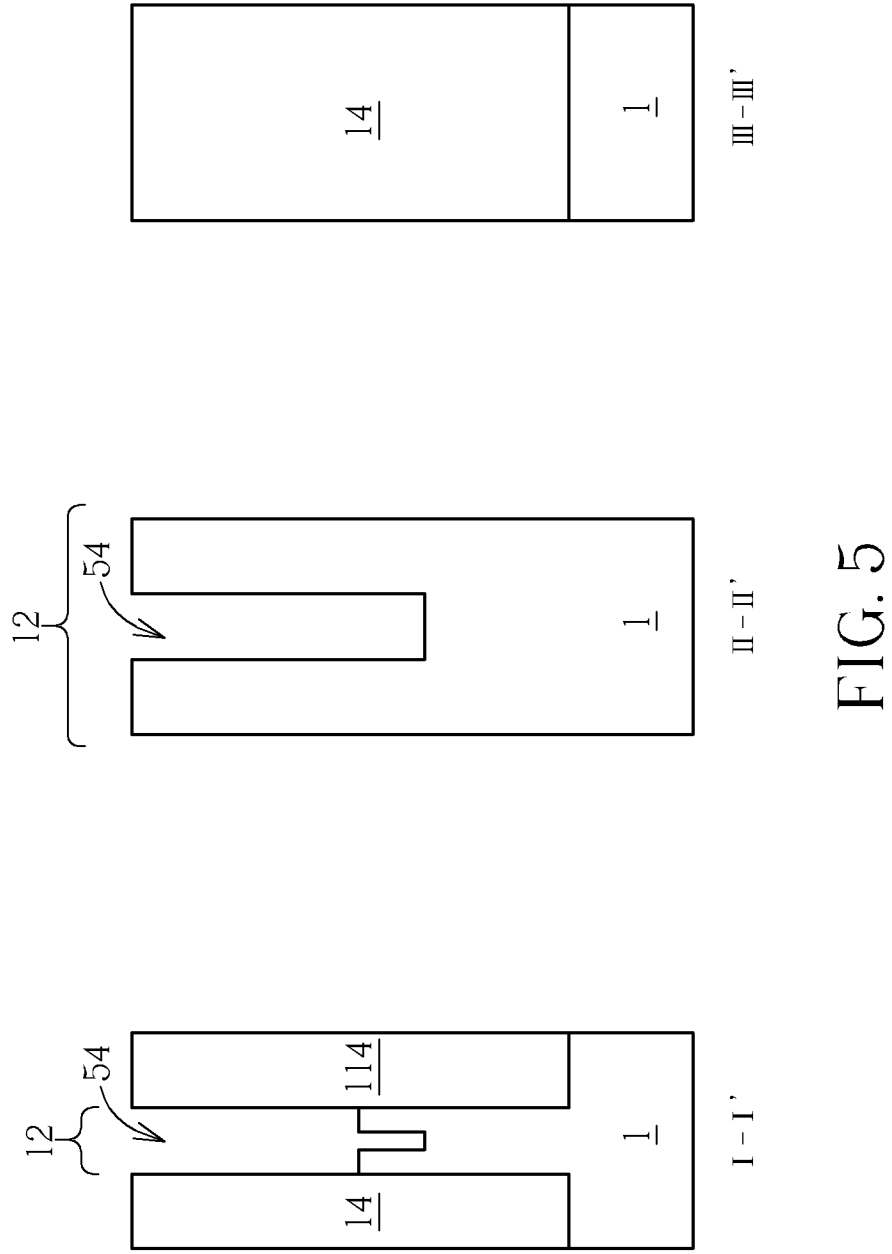
Figure 6:
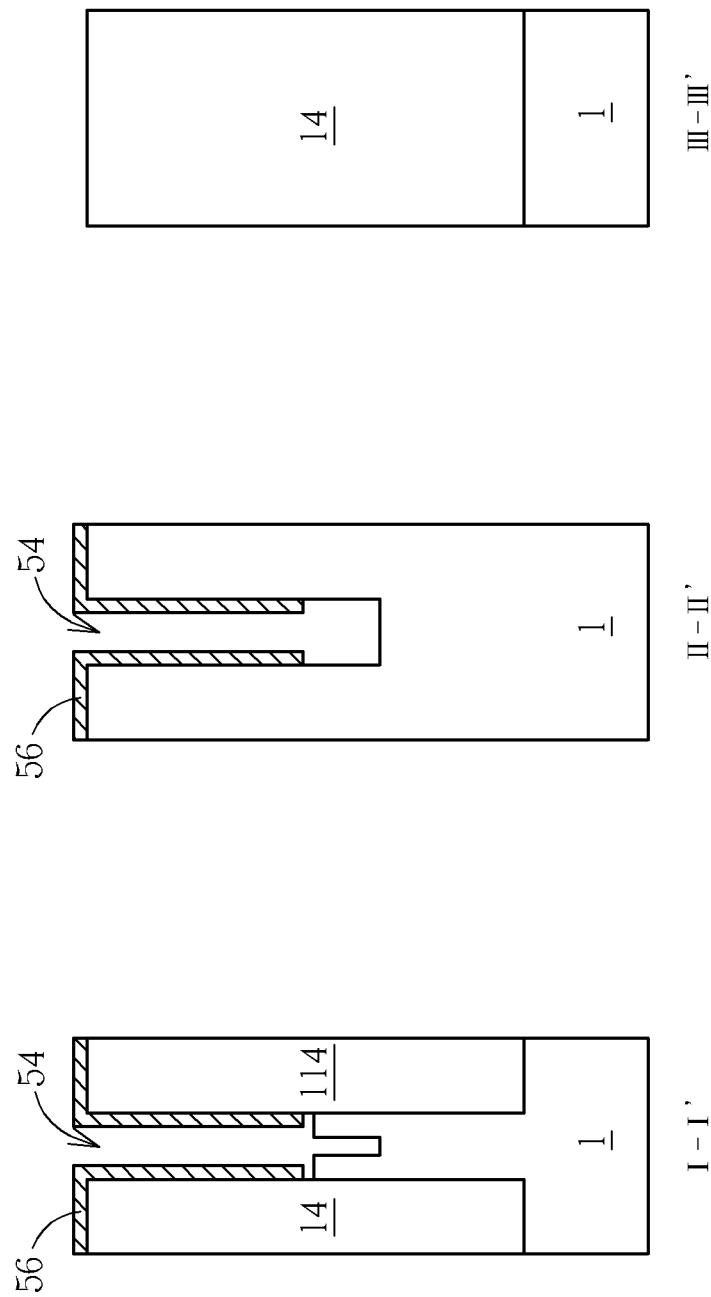
Figure 7:
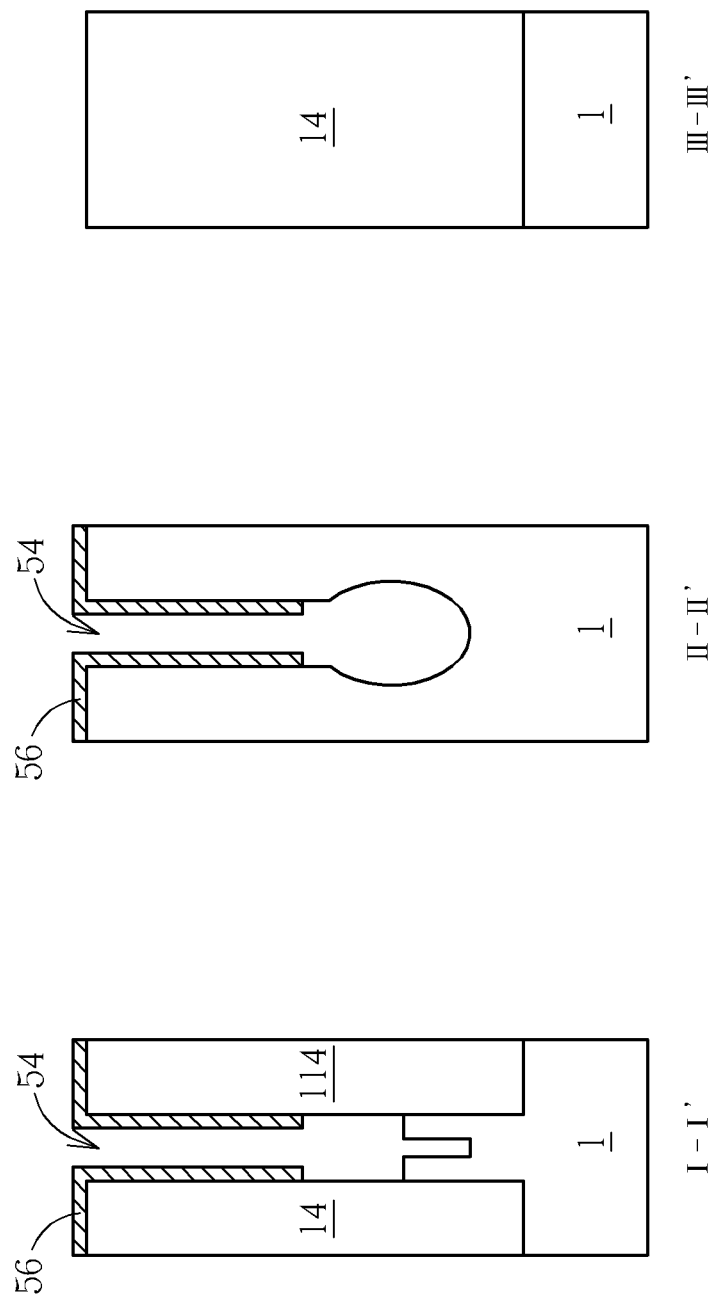
Figure 8:
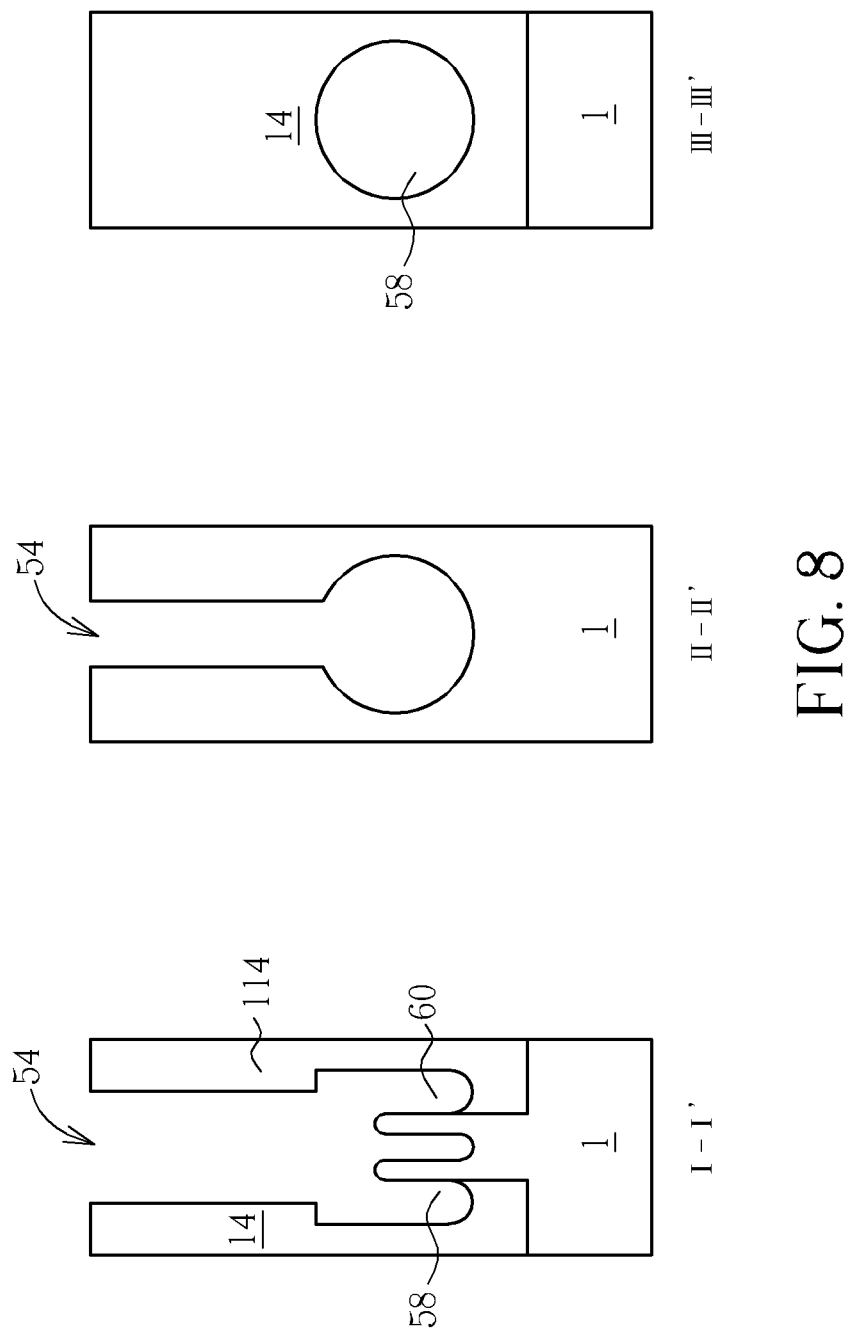

As shown in FIG. 3, a semiconductor substrate 1 has two STIs 14,114 is provided. An active region 12 is defined between the STIs 14,114. Then, a trench 50 is formed in the active region 12 between the STIs 14,114. Later, a spacer 51 is formed on two sidewalls of the trench 50. As shown in FIG. 4, the active region 12 of semiconductor substrate 1 is etched by taking the spacer 51 as a mask so as to form a trench 54. Then, as shown in FIG. 5, the spacer 51 is removed. After that, the exposed semiconductor substrate 1 is etched isotropically to make the trench 54 becomes deeper. As shown in FIG. 6, a mask layer 56 is formed a upper portion of the trench 54. As show in FIG. 7, an etching process is performed to broaden the bottom of the trench 54 and also make the trench become deeper. At this point, the bottom of the trench 54 is in a shape of an elliptic cylinder. Subsequently, as set forth in FIG. 8, the mask layer 56 is removed. Later, another etching process is performed to etch the STIs 14, 114 so as to form cylindrical recesses 58, 60 in the STIs 14, 114. At this step, the bottom of the trench 54 may also be rounded to become cylindrical.

Later, a gate oxide layer, and a gate conductor can be formed in the trenches, and the cylindrical recess. Then, a source doping region, and a drain doping region can be formed in the active region.

Because the lower part of the gate structure has a concave and convex bottom, the more channels can be formed when the transistor is turned on. Furthermore, the structure of cylindrical fins can prevent the GIDL problem.

Those skilled in the art will readily observe that numerous modifications and alterations of the device and method may be made while retaining the teachings of the invention.

What is claimed is:

1. A recessed gate transistor with cylindrical fins, comprising:
   a semiconductor substrate;
   two isolation regions disposed in the semiconductor substrate to define an active region therebetween;
   a gate structure disposed in the semiconductor substrate, wherein the gate structure comprises a upper part and a lower part, the upper part is disposed in the active region, and the lower part has a front fin disposed in one of the two isolation regions, at least one middle fin disposed in the active region, and a last fin disposed in the other one of the two isolation regions, and the front fin and the last fin are both cylindrical, and wherein the upper part electrically connects to the middle fin;
   a source doping region disposed in the active region at one side of the gate structure; and
   a drain doping region disposed in the active region at the other side of the gate structure.

2. The recessed gate transistor with cylindrical fins of claim 1, wherein the front fin is symmetric to the last fin.

3. The recessed gate transistor with cylindrical fins of claim 1, wherein the lower part further comprises a joint element connects the front fin to the middle fin next to the front fin.

4. The recessed gate transistor with cylindrical fins of claim 1, wherein the lower part further comprises a joint element connects the last fin to the middle fin next to the last fin.

5. The recessed gate transistor with cylindrical fins of claim 1, the front fin and the middle fin next to the front fin define a first recessed region, and the last fin and the middle fin next to the last fin define a second recessed region.

6. The recessed gate transistor with cylindrical fins of claim 5, wherein the semiconductor substrate in the active region has a first protrusion and a second protrusion.

7. The recessed gate transistor with cylindrical fins of claim 6, wherein the first protrusion engages with the first recessed region, and the second protrusion engages with the second recessed region.

8. The recessed gate transistor with cylindrical fins of claim 6, wherein the front fin and the middle fin next to the front fin sandwich the first protrusion.

9. The recessed gate transistor with cylindrical fins of claim 6, wherein the last fin and the middle fin next to the last fin sandwich the second protrusion.

10. The recessed gate transistor with cylindrical fins of claim 1, wherein the upper part of the gate structure comprises a vertical sidewall.

11. The recessed gate transistor with cylindrical fins of claim 1, wherein the lower part of the gate structure has a concave and convex bottom.

12. The recessed gate transistor with cylindrical fins of claim 1, wherein the lower part of the gate structure is M-shaped when view from the source doping region to the drain doping region direction.

13. The recessed gate transistor with cylindrical fins of claim 1, wherein a first radius of the front fin is greater than a second radius of the middle fin.

* * * * *